United States Patent
Tanimoto et al.

(10) Patent No.: US 10,217,701 B1
(45) Date of Patent: Feb. 26, 2019

(54) SEMICONDUCTOR DEVICE

(71) Applicant: TOSHIBA MEMORY CORPORATION, Minato-ku, Tokyo (JP)

(72) Inventors: Akira Tanimoto, Yokohama Kanagawa (JP); Hideko Mukaida, Kunitachi Tokyo (JP); Naoko Numata, Shinagawa Tokyo (JP); Kenji Miyawaki, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,349

(22) Filed: Mar. 2, 2018

(30) Foreign Application Priority Data

Aug. 29, 2017 (JP) .................................. 2017-164556

(51) Int. Cl.
*H01L 23/12* (2006.01)
*H01L 23/498* (2006.01)
(Continued)

(52) U.S. Cl.
CPC .... *H01L 23/49822* (2013.01); *H01L 23/3128* (2013.01); *H01L 23/49816* (2013.01); *H01L 23/49838* (2013.01); *H01L 23/49866* (2013.01); *H01L 23/562* (2013.01); *H01L 24/32* (2013.01); *H01L 24/33* (2013.01); *H01L 25/0652* (2013.01); *H01L 25/0657* (2013.01); *H01L 25/18* (2013.01); *H01L 24/48* (2013.01); *H01L 24/73* (2013.01); *H01L 2224/32145* (2013.01);
(Continued)

(58) Field of Classification Search
CPC ........... H01L 23/49822; H01L 23/3128; H01L 23/14; H01L 23/145; H01L 23/293; H01L 2224/40491; H01L 2224/8085
USPC .................................................. 257/701, 783
See application file for complete search history.

(56) References Cited

U.S. PATENT DOCUMENTS 6,208,525 B1    3/2001    Imasu et al.
8,929,117 B2    1/2015    Matsunaga
(Continued)

FOREIGN PATENT DOCUMENTS

JP    H11-204697 A    7/1999
JP    2015-053374 A    3/2015
(Continued)

*Primary Examiner* — Nitin Parekh
(74) *Attorney, Agent, or Firm* — Foley & Lardner LLP; Pavan K. Agarwal

(57) ABSTRACT

A semiconductor device includes a package substrate having a first surface and a second surface. A semiconductor chip is provided on the first surface of the package substrate and includes a semiconductor element. An adhesive is provided between the semiconductor chip and the package substrate. A metal bump is provided on the second surface. A package substrate is a multilayer substrate that includes first to fourth wiring layers and first to third resin layers. CTE1<CTE2<CTE3<CTE4 is satisfied where coefficients of thermal expansion of the semiconductor chip, the first to third resin layers, the first to fourth wiring layers, and the adhesive are CTE1 to CTE4, respectively. EM1>EM3>EM2>EM4 is satisfied where elastic moduli of the semiconductor chip, the first to third resin layers, the first to fourth wiring layers, and the adhesive are EM1 to EM4, respectively.

14 Claims, 4 Drawing Sheets

(51) Int. Cl.
  *H01L 25/065* (2006.01)
  *H01L 23/00* (2006.01)
  *H01L 23/31* (2006.01)
  *H01L 25/18* (2006.01)
  *H05K 1/18* (2006.01)
  *H05K 1/11* (2006.01)

(52) U.S. Cl.
  CPC .............. *H01L 2224/32225* (2013.01); *H01L 2224/33181* (2013.01); *H01L 2224/48106* (2013.01); *H01L 2224/48225* (2013.01); *H01L 2224/73215* (2013.01); *H01L 2224/73265* (2013.01); *H01L 2225/0651* (2013.01); *H01L 2225/06562* (2013.01); *H01L 2225/06586* (2013.01); *H01L 2924/3512* (2013.01); *H05K 1/111* (2013.01); *H05K 1/181* (2013.01); *H05K 2201/068* (2013.01); *H05K 2201/10378* (2013.01); *H05K 2201/10734* (2013.01)

(56) References Cited

U.S. PATENT DOCUMENTS

| | | |
|---|---|---|
| 9,117,741 B2 | 8/2015 | Fujii |
| 2003/0178726 A1* | 9/2003 | Ogawa ................ H01L 21/4857 257/758 |
| 2005/0252682 A1* | 11/2005 | Shimoto ............. H01L 21/4857 174/260 |
| 2006/0079609 A1* | 4/2006 | Nishioka .................... C08J 5/18 523/400 |
| 2007/0164349 A1* | 7/2007 | Nakasato ............ H01L 21/6835 257/318 |
| 2008/0036097 A1* | 2/2008 | Ito ........................... C08L 63/00 257/778 |
| 2009/0267212 A1* | 10/2009 | Wada ..................... H01L 21/563 257/687 |
| 2010/0032826 A1* | 2/2010 | Tachibana ............... C08L 63/00 257/692 |
| 2015/0116968 A1 | 4/2015 | Yamada et al. |
| 2015/0380061 A1 | 12/2015 | Matsumoto et al. |
| 2016/0043024 A1* | 2/2016 | Furutani ........... H01L 23/49827 361/783 |
| 2016/0141272 A1 | 5/2016 | Inakawa |
| 2016/0163625 A1 | 6/2016 | Imazeki et al. |
| 2017/0010639 A1 | 1/2017 | Matsumoto et al. |
| 2018/0011402 A1* | 1/2018 | Yuba ....................... G03F 7/037 |

FOREIGN PATENT DOCUMENTS

| | | |
|---|---|---|
| TW | 418467 | 1/2001 |
| TW | 201324697 A | 6/2013 |

* cited by examiner

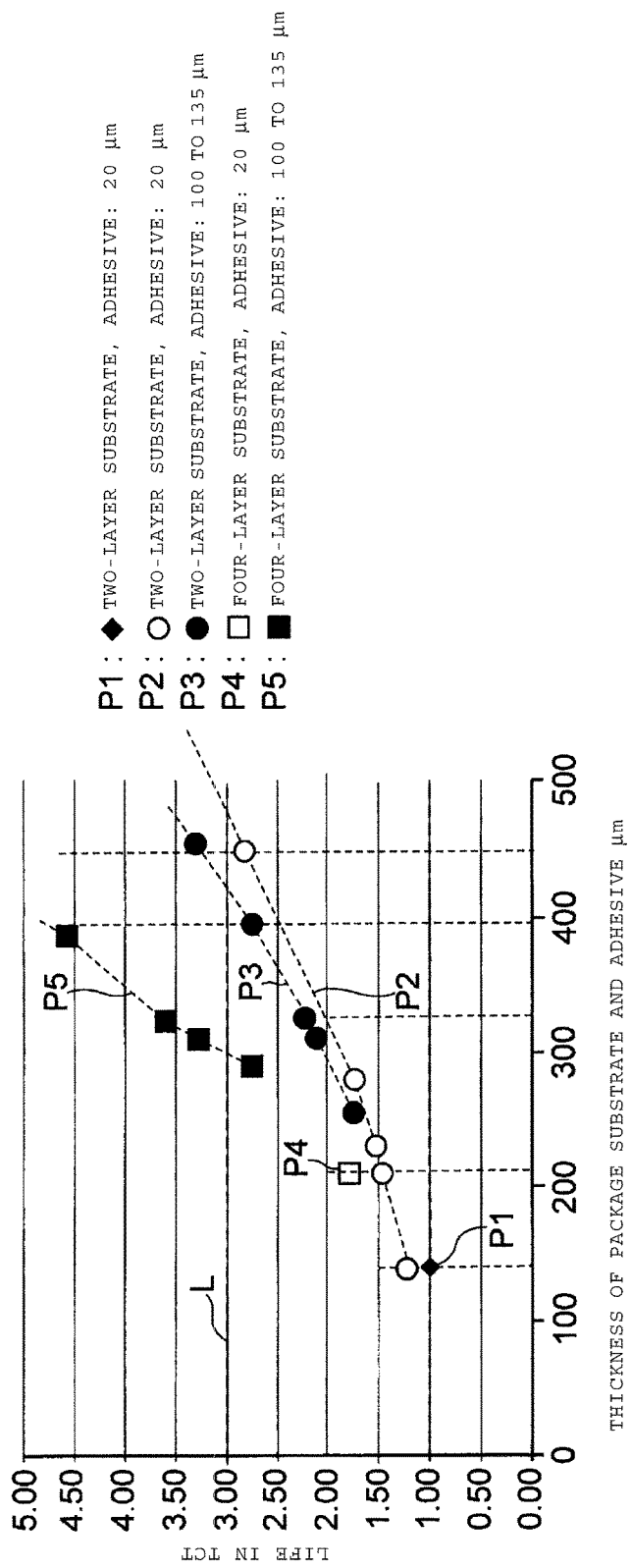

SEMICONDUCTOR DEVICE

CROSS-REFERENCE TO RELATED APPLICATION

This application is based on claims priority to Japanese Patent Application No. 2017-164556, filed Aug. 29, 2017, the entire contents of which are incorporated herein by reference.

FIELD

Embodiments described herein relate generally to a semiconductor device.

BACKGROUND

A semiconductor device can be configured as a semiconductor module by stacking a plurality of semiconductor packages on a mounting substrate as seen in, for example, an eMMC (embedded Multimedia Card). The plurality of semiconductor packages each include or are connected to, for example, a BGA (Ball Grid Array), are stacked on the mounting substrate, and are electrically connected to one another.

After mounting the semiconductor packages on the mounting substrate, a TCT (Thermal Cycle Test) or the like can be conducted. In-vehicle semiconductor products, for example, may have design specifications that call for high TCT resistance characteristics.

DESCRIPTION OF THE DRAWINGS

FIG. 3 is a graph showing a life of a solder bump relative to thicknesses of a package substrate and an adhesive.

DETAILED DESCRIPTION

One or more example embodiments provide for a semiconductor device capable of mitigating a stress applied to a bump (e.g. a solder bump) disposed between a mounting substrate and a semiconductor package and having high reliability.

In general, according to one or more embodiments, a semiconductor device includes a package substrate having a first surface and a second surface opposite to the first surface. A semiconductor chip is provided on the first surface of the package substrate and has a semiconductor element. An adhesive is provided between the semiconductor chip and the package substrate. A metal bump is provided on the second surface. The package substrate is a multilayer substrate that includes first to fourth wiring layers; a first resin layer provided between the first wiring layer and the second wiring layer; a second resin layer provided between the second wiring layer and the third wiring layer; and a third resin layer provided between the third wiring layer and the fourth wiring layer. An expression (1) is satisfied when it is assumed that a coefficient of thermal expansion of the semiconductor chip is CTE1, a coefficient of thermal expansion of the first to third resin layers is CTE2, a coefficient of thermal expansion of the first to fourth wiring layers is CTE3, and a coefficient of thermal expansion of the adhesive is CTE4:

$$CTE1 < CTE2 < CTE3 < CTE4 \qquad (1).$$

An expression (2) is satisfied when it is assumed that an elastic modulus of the semiconductor chip is EM1, an elastic modulus of the first to third resin layers is EM2, an elastic modulus of the first to fourth wiring layers is EM3, and an elastic modulus of the adhesive is EM4:

$$EM1 > EM3 > EM2 > EM4 \qquad (2).$$

Embodiments according to the present disclosure will be described below with reference to the drawings. The presently described embodiments are not intended to limit the present disclosure. In the embodiments described herein, a vertical direction of a semiconductor substrate represents a relative direction when it is assumed that a surface of the semiconductor substrate adhesively attached to a package substrate is either a lower or upper surface, and the vertical direction sometimes differs from a vertical direction according to a direction of acceleration due to gravity. The drawings are schematic or conceptual and depicted ratios of sections, components and the like are not necessarily the same as actual ratios in real implementations. In the specification and the drawings, elements similar to, or the same as, those already described are denoted by same reference signs and description thereof is omitted as appropriate.

Figure 1A:
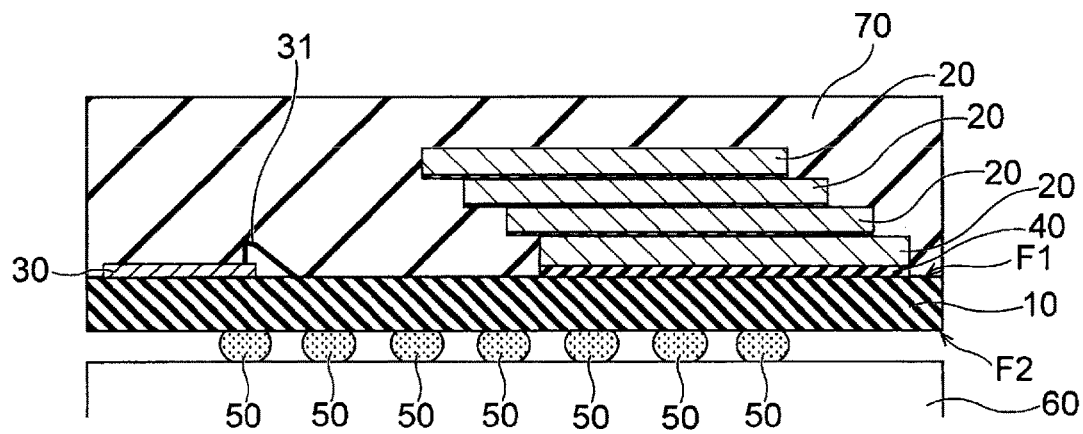
FIGS. 1A and 1B are cross-sectional views each showing an example of a configuration of a semiconductor device according to one or more embodiments of the present disclosure.
Figure 1B:
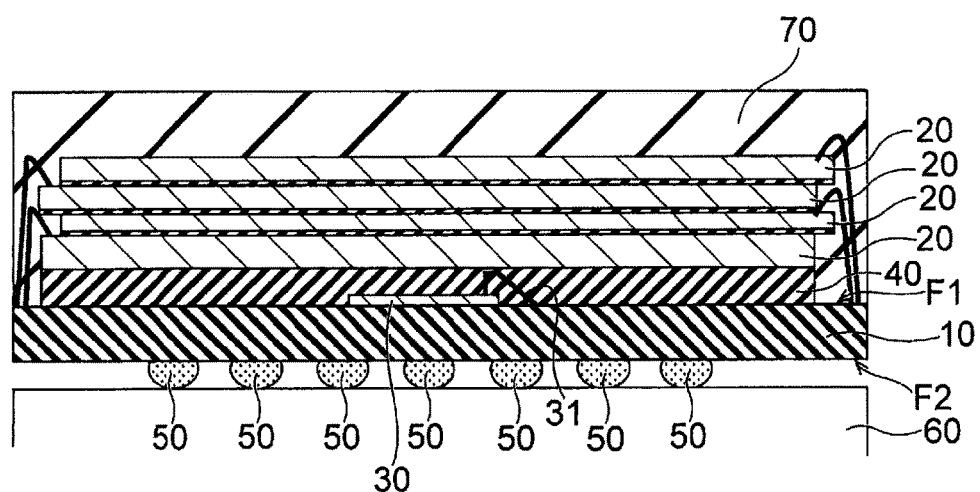

FIGS. 1A and 1B are cross-sectional views showing examples of configurations of semiconductor devices according to one or more embodiments of the present disclosure. FIG. 1A shows a semiconductor device used for, for example, an eMMC. FIG. 1B shows a semiconductor device used for, for example, a UFS (Universal Flash Storage). Aspects of the present disclosure are applicable to at least the semiconductor devices shown in FIGS. 1A and 1B.

The semiconductor device according to one or more embodiments includes a package substrate 10, one or more semiconductor chips 20, a controller 30, an adhesive 40, a solder bump 50, a mounting substrate 60, and a sealing resin 70.

The package substrate 10 has a first surface F1 and a second surface F2 opposite to the first surface F1. The package substrate 10 is a multilayer substrate including a plurality of wiring layers and a plurality of resin layers, as described with reference to FIG. 2.

A semiconductor chip 20 is provided on the first surface F1 of the package substrate 10, and includes semiconductor elements provided on, for example, a silicon substrate. The semiconductor chip 20 may be, for example, a NAND EEPROM (Electrically Erasable-Programmable Read Only Memory). The semiconductor elements may include a transistor, a resistor, a capacitor, or the like provided on the silicon substrate. In in or more embodiments, a plurality of semiconductor chips 20 including the semiconductor chip 20 are stacked on the package substrate 10.

The adhesive 40 is provided between the semiconductor chips 20 and the package substrate 10, and adhesively bonds the semiconductor chips 20 onto the package substrate 10. The adhesive 40 may be a so-called DAF (Die Attachment Film). The DAF may include epoxy resin, acrylic resin, and/or phenol resin.

The controller 30 is a semiconductor chip that controls the plurality of semiconductor chips 20. The controller 30 is provided on the first surface F1 of the package substrate 10, and includes semiconductor elements provided on, for example, a silicon substrate. The controller 30 is connected to a wiring layer (not shown in FIGS. 1A and 1B) of the package substrate 10 via, for example, a wire 31 and is electrically connected to the plurality of semiconductor chips 20.

The solder bump 50 is provided on the second surface F2 of the package substrate 10 and connected to another wiring layer of the package substrate 10. The solder bump 50 is also connected to the mounting substrate 60 and electrically connects the package substrate 10 to the mounting substrate 60. In one or more embodiments, a bump formed from a semiconductor material may be used.

The mounting substrate 60 is a multilayer substrate including a plurality of wiring layers and a plurality of resin layers. The mounting substrate 60 is electrically connected to the package substrate 10 via the solder bump 50. The mounting substrate 60 be disposed under a plurality of semiconductor packages, and the mounting substrate 60 and the plurality of semiconductor packages may define a module.

The sealing resin 70 covers and protects the semiconductor chips 20, the controller 30, the wire 31, and the like.

Figure 2:
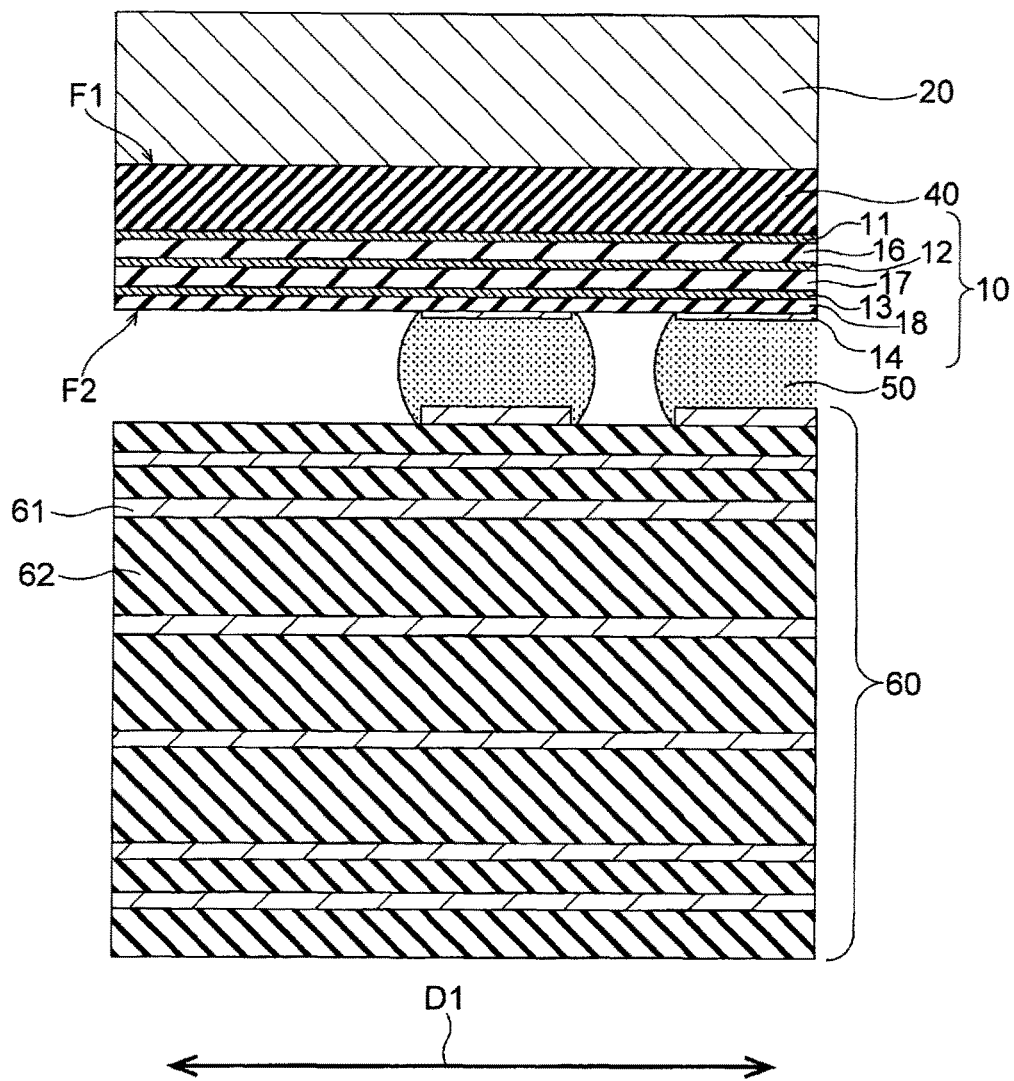
FIG. 2 is a cross-sectional view showing configurations of solder bumps and peripheral portions thereof according to one or more embodiments of the present disclosure.

FIG. 2 is a cross-sectional view showing configurations of one or more embodiments of the solder bump 50 and peripheral portions thereof in more detail. The package substrate 10 is a multilayer substrate that includes first to fourth wiring layers 11 to 14, and first to third resin layers 16 to 18. The first resin layer 16 is provided between the first wiring layer 11 and the second wiring layer 12, the second resin layer 17 is provided between the second wiring layer 12 and the third wiring layer 13, and the third resin layer 18 is provided between the third wiring layer 13 and the fourth wiring layer 14. A conductive material that includes any one or more of, for example, copper, gold, and silver is used for the first to fourth wiring layers 11 to 14. An insulating material that is any one or more of, for example, glass epoxy resin, phenol resin, fluorocarbon resin (for example, polytetrafluoroethylene), and polyimide is used for the first to third resin layers 16 to 18.

Each semiconductor chip 20 includes, for example, a silicon substrate and semiconductor elements are disposed on the silicon substrate. The semiconductor chip 20 is fixed onto the package substrate 10 by the adhesive 40.

The fourth wiring layer 14 is disposed on the second surface F2 of the package substrate 10 and may include, or may be in contact with, connection portions disposed below the second surface F2 and may contact one or more of the solder bumps 50. The connection portions (denoted by reference sign 15 in FIGS. 4A and 4B) of the fourth wiring layer 14 to which the solder bumps 50 are respectively connected are electrically connected to the wiring layer on the mounting substrate 60 via the solder bumps 50.

The mounting substrate 60 is a multilayer substrate in which a plurality of wiring layers 61 and a plurality of resin layers 62 are stacked. A conductive material that is anyone or more of, for example, copper, gold, and silver is used for the wiring layers 61. An insulating material that is any one or more of, for example, glass epoxy resin, phenol resin, fluorocarbon resin (for example, polytetrafluoroethylene), and polyimide is used for the resin layers 62.

Coefficients of thermal expansion and elastic moduli of components of the package substrate 10 will now be described. When it is assumed that a coefficient of thermal expansion (CTE) of the semiconductor chip 20 (including, for example, the silicon substrate) is CTE1, the CTE of the first to third resin layers 16 to 18 (including, for example, glass epoxy resin) is CTE2, the CTE of the first to fourth wiring layers 11 to 14 (including, for example, copper) is CTE3, and the CTE of the adhesive 40 (including, for example, epoxy resin) is CTE4, Expression (1) is satisfied:

$$CTE1 < CTE2 < CTE3 < CTE4 \qquad (1).$$

As described herein, a first CTE being smaller than a second CTE may refer to the value of the first CTE being about 0.9 or less times the value of the second CTE, about 0.8 times or less, or about 0.7 times or less.

In addition, when it is assumed that an elastic modulus (EM) of the semiconductor chip 20 (including, for example, the silicon substrate) is EM1, that of the first to third resin layers 16 to 18 (including, for example, glass epoxy resin) is EM2, that of the first to fourth wiring layers 11 to 14 (including, for example, copper) is EM3, and that of the adhesive 40 (including, for example, epoxy resin) is EM4, Expression (2) is satisfied:

$$EM1 > EM3 > EM2 > EM4 \qquad (2).$$

As described herein, a first EM being smaller than a second EM may refer to the value of the first EM being about 1.1 or more times the value of the second EM, about 1.2 times or more, or about 1.3 times or more.

Therefore, the coefficients of thermal expansion CTE2 and CTE3 of the package substrate 10 components and the coefficient of thermal expansion CTE4 of the mounting substrate 60 are higher than the coefficient of thermal expansion CTE1 of the semiconductor chips 20. In addition, the elastic moduli EM2 and EM3 of the package substrate 10 components and the elastic modulus EM4 of the mounting substrate 60 are lower than the elastic modulus EM1 of the semiconductor chips 20. That is, the package substrate 10 and the mounting substrate 60 are more prone to be flexible than the semiconductor chips 20 and more prone to absorb or mitigate a strain stress than the semiconductor chips 20.

FIG. 3 is a graph showing a life of the solder bump 50 relative to thicknesses of the package substrate 10 and the adhesive 40. A horizontal axis indicates a total thickness of the package substrate 10 and the adhesive 40 in micrometers (μm). A vertical axis indicates, on a relative basis, the life of each solder bump 50 in a TCT test. In FIG. 3 a life of a sample P1 is set as a base value 1.00. Ratios of lives of other samples P2 to P5 to the sample P1 are shown.

In this graph, the samples P1 to P3 each correspond to a package substrate 10 having a two-layer wiring structure and including two wiring layers (for example, wiring layers 11 and 14). On the other hand, the samples P4 and P5 each correspond to a package substrate 10 having a four-layer wiring structure including four wiring layers (for example, wiring layers 11 to 14). That is, the package substrates 10 corresponding to the samples P4 and P5 are similar in configuration to the package substrate 10 according to the embodiments shown in FIG. 2. In addition, a thickness of the adhesive 40 of the semiconductor device corresponding to each of the samples P1 and P2 is about 20 μm. On the other hand, a thickness of the adhesive 40 of the semiconductor device corresponding to each of the samples P3 and P5 is about 100 μm to about 135 μm and relatively large.

Certain advantages of the semiconductor device according to the present embodiments attained from such a structural difference will now be described. It is noted that a thickness of the package substrate 10 of the four-layer wiring structure is, for example, about 190 μm. In addition, broken lines indicate desired levels in the TCT test. The semiconductor device corresponding to the sample P1 includes the package substrate 10 of the two-layer wiring structure and the adhesive 40 having a thickness of about 20 µm. The sample P1 is a reference for the samples P2 to P5; thus, the life of the solder bump 50 in the sample P1 is assumed to be 1. As described below, a solder resist of the package substrate 10 corresponding to the sample P1 differs in structure from solder resists of the package substrates 10 corresponding to the other samples P2 to P5. Therefore, while FIG. 3 illustrates the sample P1 as a reference, the samples P2 to P5 having a same or similar structure of the solder resist will now be compared.

The semiconductor device corresponding to the sample P2 has the package substrate 10 of the two-layer wiring structure and the adhesive 40 having a thickness of about 20 µm. The plot for the sample P2 indicates the life of the solder bump 50 depending on the thickness of the package substrate 10. When reference is made to the sample P2, it is understood that a stress applied to the solder bump 50 is relaxed by increasing the thickness of the package substrate 10, thereby extending the life of the sample P2.

The semiconductor device corresponding to the sample P3 has the package substrate 10 of the two-layer wiring structure and the adhesive 40 having a thickness of about 100 µm to about 135 µm. The plot for the sample P3, when compared to the plot for the sample P2, indicates the life of the solder bump 50 depending on the thickness of the adhesive 40. By comparing the sample P2 with the sample P3, it is understood that the stress applied to the solder bump 50 is relaxed by increasing the thickness of the adhesive 40 even if the total thickness of the package substrate 10 and the adhesive 40 of the sample P2 is about the same as that of the sample P3.

The semiconductor device corresponding to the sample P4 has the package substrate 10 of the four-layer wiring structure and the adhesive 40 having a thickness of about 20 µm. By comparing the sample P2 with the sample P4 when the total thickness of the package substrate 10 and the adhesive 40 is equally about 210 µm, it is understood that the life of the solder bump 50 is extended depending on the structure of the package substrate 10. For example, the sample P2 is compared with the sample P4 when the total thickness of the package substrate 10 and the adhesive 40 is equally about 210 µm. At this time, the sample P4 of the four-layer wiring structure has a higher improvement than that of the sample P2 of the two-layer wiring structure with respect to the life of the solder bump 50. That is, it can be understood that the stress applied to the solder bump 50 is relaxed by making the package substrate 10 to have the four-layer wiring structure even if the total thickness of the package substrate 10 and the adhesive 40 is about the same.

The semiconductor device corresponding to the sample P5 has the package substrate 10 of the four-layer wiring structure and the adhesive 40 having a thickness of 100 µm to 135 µm. The plot for the sample P5 indicates the life of the solder bump 50 depending on the structure of the package substrate 10, and the life of the solder bump 50 depending on the thickness of the adhesive 40. By comparing the sample P3 with the sample P5, it is understood that the sample P5 of the four-layer wiring structure has a far higher improvement than that of the sample P3 of the two-layer wiring structure with respect to the life of the solder bump 50. That is, it can be understood that the stress applied to the solder bump 50 is relaxed by making the package substrate 10 to have the four-layer wiring structure even if the total thickness of the package substrate 10 and the adhesive 40 is about the same.

The semiconductor device according to an aspect described herein corresponds to the sample P5, and has the package substrate 10 of the four-layer wiring structure, and has the adhesive 40 having a relatively large thickness of about 100 µm to about 135 µm. Therefore, it is possible to reduce the stress applied to the solder bump 50, such as during the TCT test and to extend a life of the semiconductor device.

In the TCT test, the mounting substrate 60 configured with the resin layers and the wiring layers relatively greatly expands or contracts but the semiconductor chip 20 configured with the silicon substrate does not greatly expand. Therefore, if the package substrate 10 and the adhesive 40 are thin or the structure of the package substrate 10 is such that it is difficult for the package substrate 10 (including, for example, the silicon substrate) to expand and contract, a difference between the mounting substrate 60 and the semiconductor chips 20 in expansion and contraction is applied to the solder bump 50 as a relatively high strain stress. This can cause cracking in a connection portion between the solder bump 50 and either the package substrate 10 or the mounting substrate 60.

For example, while the mounting substrate 60 configured with resin or the like relatively largely expands and contracts due to a change in temperature, the silicon substrate of the package substrate 10 may not correspondingly expand and contract (e.g. due to a difference in CTEs of the silicon substrate of the package substrate 10 and the mounting substrate 60 configured with resin or the like). Owing to this, the strain stress is applied to the bump 50 between the mounting substrate 60 and the package substrate 10, which disadvantageously causes the cracking between the bump 50 and a metal electrode of a semiconductor package connected to the bump 50. In this case, the semiconductor device may be unable to exhibit desirable TCT resistance characteristics, and reliability of the semiconductor device disadvantageously degrades.

By contrast, as shown in FIG. 3, if the semiconductor device has the package substrate 10 of the four-layer wiring structure rather than the two-layer wiring structure and the adhesive 40 having the large thickness, it is possible to extend the life of the semiconductor device. Therefore, the semiconductor device according to one or more presently described embodiments includes the package substrate 10 having the four-layer wiring structure and the adhesive 40 having the thickness as large as 100 µm to 135 µm. It is thereby possible to make relatively low the stress applied to the solder bump 50 and prevent occurrence of the cracking in the connection portion between the solder bump 50 and either the package substrate 10 or the mounting substrate 60. As a result, it is possible to extend the life of the semiconductor device during the TOT test. It is noted that the semiconductor device according to the present embodiment (for example, sample P5) can surpass a level of a line L shown in FIG. 3 (that is, can have a life about 3 times or greater than a life of the sample P1).

Figure 4A:
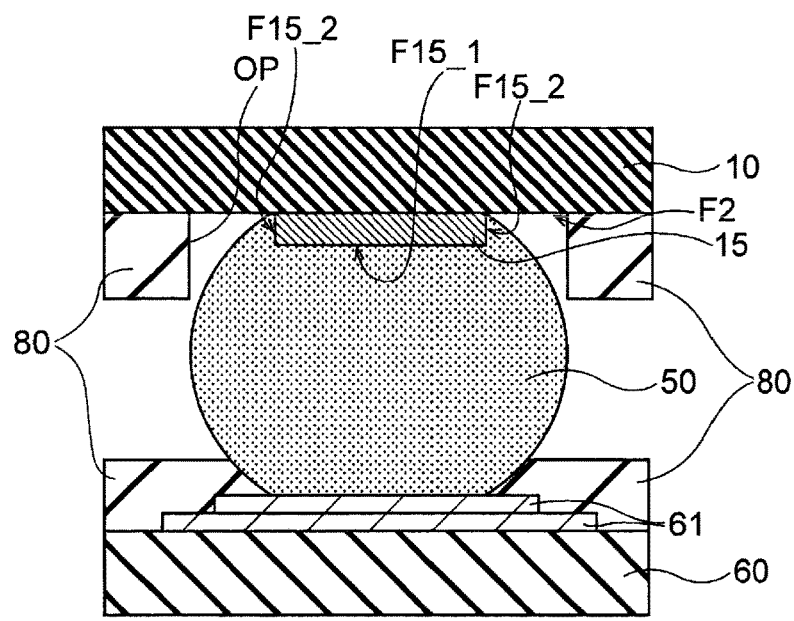
FIGS. 4A and 4B are a cross-sectional view and a plan view respectively showing configurations of a solder bump and peripheral portions thereof according to one or more embodiments of the present disclosure.
Figure 4B:
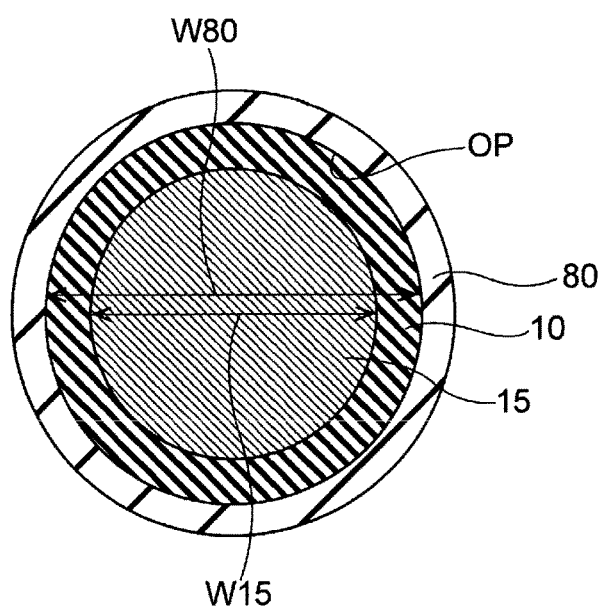

FIGS. 4A and 4B are a cross-sectional view and a plan view showing the configurations of the solder bump 50 and peripheral portions thereof according to one or more embodiments, respectively. A connection portion 15 and a solder resist 80 are provided on the second surface F2 of the package substrate 10. The connection portion 15 can be an interconnection portion or a wiring portion of the fourth wiring layer 14 connected to the solder bump 50. In one or more embodiments, the connection portion 15 may be a conductive layer provided separately from the fourth wiring layer 14. The solder resist 80 is provided around the solder bump 50 in such a manner as to define an opening OP at a position of the solder bump 50, or that accommodates the solder bump.

Here, as shown in FIG. 4B, a diameter W80 of the opening OP of the solder resist 80 is larger than a diameter W15 of the connection portion 15. The solder resist 80 does not contact the connection portion 15 and does not cover or contact part of a side surface (or lateral surface) F15_2 and a front surface F15_1 of the connection portion 15. Since a solder is repelled by the solder resist 80 and adheres to portions where the solder resist 80 is not provided, the solder bump 50 is formed to contact not only the front surface F15_1 but also at least a portion of the side surface F15_2 of the connection portion 15. An area of a contact between the solder bump 50 and the connection portion 15 thereby increases, thus increasing a physical joint strength between the solder bump 50 and the connection portion 15.

In some comparative implementations, the solder resist 80 contacts the connection portion 15 and covers part of the side surface F15_2 and the front surface F15_1 thereof, the solder bump 50 contacts the front surface F15_1 of the connection portion 15 and does not contact the side surface F15_2 thereof. Therefore, the joint strength between the solder bump 50 and the connection portion 15 falls, and cracking tends to occur between the solder bump 50 and the connection portion 15. In addition, a contact resistance between the solder bump 50 and the connection portion 15 increases.

On the other hand, according to the present embodiment, the solder bump 50 contacts not only the front surface F15_1 of the connection portion 15 but also the side surface F15_2 thereof. This can increase the physical joint strength between the solder bump 50 and the connection portion 15 and prevent the cracking between the solder bump 50 and the connection portion 15.

In the case of the sample P1 shown in FIG. 3, for example, the solder resist 80 has a configuration to contact the connection portion 15 and to cover part of the side surface F15_2 and the front surface F15_1 thereof. In the case of the sample P2, the solder resist 80 has a configuration not to contact the connection portion 15 and not to cover part of the side surface F15_2 and the front surface F15_1 thereof. The samples P1 and P2 may be similar in configuration in other respects. By comparing the samples P1 and P2, it is understood that the life of the solder bump 50 is extended. The semiconductor device according to the present embodiment can thereby relax the stress applied to the solder bump 50 between the mounting substrate 60 and the package substrate 10 and improve the reliability. The semiconductor device according to the present embodiment can also reduce the contact resistance between the solder bump 50 and the connection portion 15.

When the semiconductor device according to the present embodiment is viewed from above, dimensions of the semiconductor device may comply with MO-276K Standard of JEDEC (Joint Electron Device Engineering Council). For example, when the semiconductor device according to the present embodiment is viewed from above, the dimensions of the semiconductor device may be anyone or more of 11.5 millimeters (mm)×13 mm, 12 mm×16 mm, and 14 mm×18 mm specified under the MO-276K Standard. Nevertheless, the dimensions of the semiconductor device are not limited to these but may be any one or more of 6 mm×7 mm, 3 mm×7.5 mm, 3 mm×8 mm, 6 mm×8 mm, 7 mm×9 mm, 11 mm×11.5 mm, 6 mm×12 mm, 9 mm×12 mm, 12 mm×15 mm, 12 mm×18 mm, 16 mm×20 mm, and 17 mm×22 mm.

The semiconductor device according to the present embodiment may comply with other standards and the semiconductor device according to the present embodiments is applicable to configurations of various sizes, as appropriate.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
   a package substrate having a first surface and a second surface opposite to the first surface;
   a semiconductor chip wire bonded to the first surface of the package substrate and comprising a semiconductor element;
   an adhesive provided directly between the semiconductor chip and the package substrate; and
   a metal bump provided on the second surface of the package substrate, wherein
   the package substrate is a multilayer substrate that includes:
      a first wiring layer, a second wiring layer, a third wiring layer, and a fourth wiring layer;

a first resin layer provided between the first wiring layer and the second wiring layer;

a second resin layer provided between the second wiring layer and the third wiring layer; and a third resin layer provided between the third wiring layer and the fourth wiring layer, an expression (1) is satisfied when where a coefficient of thermal expansion of the semiconductor chip is CTE1, a coefficient of thermal expansion of each of the first, second and third resin layers is CTE2, a coefficient of thermal expansion of each of the first, second, third, and fourth wiring layers is CTE3, and a coefficient of thermal expansion of the adhesive is CTE4:

$$CTE1<CTE2<CTE3<CTE4 \qquad (1), \text{ and}$$

an expression (2) is satisfied where an elastic modulus of the semiconductor chip is EM1, an elastic modulus of each of the first, second, and third resin layers is EM2, an elastic modulus of each of the first, second, third, and fourth wiring layers is EM3, and an elastic modulus of the adhesive is EM4:

$$EM1>EM3>EM2>EM4 \qquad (2).$$

2. The semiconductor device according to claim 1, further comprising:

a mounting substrate electrically connected to the package substrate via the metal bump, wherein the mounting substrate is a multilayer substrate comprising a plurality of wiring layers and a plurality of resin layers.

3. The semiconductor device according to claim 2, wherein:

each of the first, second, third, and fourth wiring layers comprise a conductive material that includes one or more of copper, gold, or silver, the first, second, and third resin layers comprise an insulating material that includes one or more of glass epoxy resin, phenol resin, polytetrafluoroethylene, or polyimide, the semiconductor chip includes a silicon substrate, each of the plurality of wiring layers of the mounting substrate comprise a conductive material that includes one or more of copper, gold, or silver, and each of the plurality of resin layers of the mounting substrate comprise an insulating material that includes one or more of glass epoxy resin, phenol resin, polytetrafluoroethylene, or polyimide.

4. The semiconductor device according to claim 3, further comprising:

a solder resist provided around the metal bump on the second surface of the package substrate and defining an opening in which the metal bump is disposed, wherein:

the fourth wiring layer comprises a connection portion connected to the metal bump, and a diameter of the opening of the solder resist is larger than a diameter of the connection portion of the fourth wiring layer.

5. The semiconductor device according to claim 4, wherein the metal bump contacts a front surface and a side surface of the connection portion.

6. The semiconductor device according to claim 4, wherein the solder resist does not contact the connection portion, and the metal bump is provided in a region of the second surface of the package substrate where the solder resist is not provided.

7. The semiconductor device according to claim 1, wherein a thickness of the adhesive is in a range of about 100 μm to about 135 μm.

8. The semiconductor device according to claim 1, wherein dimensions of the semiconductor device, when viewed from above, comply with an MO-276K Standard of Joint Electron Device Engineering Council (JEDEC).

9. The semiconductor device according to claim 1, wherein each of the first, second, third, and fourth wiring layers comprise a conductive material that includes one or more of copper, gold, or silver, each of the first, second, and third resin layers comprise an insulating material that includes one or more of glass epoxy resin, phenol resin, polytetrafluoroethylene, or polyimide, the semiconductor chip includes a silicon substrate, each of the plurality of wiring layers of the mounting substrate comprise a conductive material that includes one or more of copper, gold, or silver, and each of the plurality of resin layers of the mounting substrate comprise an insulating material that includes one or more of glass epoxy resin, phenol resin, polytetrafluoroethylene, or polyimide.

10. The semiconductor device according to claim 1, further comprising:

a solder resist provided around the metal bump on the second surface of the package substrate and defining an opening in which the metal bump is disposed, wherein:

the fourth wiring layer comprises a connection portion connected to the metal bump, and a diameter of the opening of the solder resist is larger than a diameter of the connection portion of the fourth wiring layer.

11. A semiconductor device comprising:

a package substrate having a first surface and a second surface opposite to the first surface;

a semiconductor chip wire bonded to the first surface of the package substrate and comprising a semiconductor element;

an adhesive provided directly between the semiconductor chip and the package substrate;

a metal bump provided on the second surface of the package substrate; and a solder resist provided around the metal bump on the second surface of the package substrate and defining an opening in which the metal bump is disposed, wherein the package substrate is a multilayer substrate that includes:

a first wiring layer, a second wiring layer, a third wiring layer, and a fourth wiring layer;

a first resin layer provided between the first wiring layer and the second wiring layer;

a second resin layer provided between the second wiring layer and the third wiring layer; and a third resin layer provided between the third wiring layer and the fourth wiring layer, an expression (1) is satisfied where a coefficient of thermal expansion of the semiconductor chip is CTE1, a coefficient of thermal expansion of the first, second and third resin layers, each is CTE2, a coefficient of thermal expansion of the first, second, third, and fourth wiring layers, each is CTE3, and a coefficient of thermal expansion of the adhesive is CTE4:

$$CTE1<CTE2<CTE3<CTE4 \qquad (1),$$

the fourth wiring layer comprises a connection portion connected to the metal bump, and a diameter of the opening of the solder resist is larger than a diameter of the connection portion of the fourth wiring layer.

12. The semiconductor device according to claim 11, wherein
the metal bump contacts a front surface and a side surface of the connection portion.

13. A semiconductor device comprising:
a package substrate having a first surface and a second surface opposite to the first surface;
a semiconductor chip wire bonded to the first surface of the package substrate and comprising a semiconductor element;
an adhesive provided directly between the semiconductor chip and the package substrate;
a metal bump provided on the second surface of the package substrate; and
a solder resist provided around the metal bump on the second surface of the package substrate and defining an opening in which the metal bump is disposed, wherein
the package substrate is a multilayer substrate that includes:
a first wiring layer, a second wiring layer, a third wiring layer, and a fourth wiring layer;
a first resin layer provided between the first wiring layer and the second wiring layer;
a second resin layer provided between the second wiring layer and the third wiring layer; and
a third resin layer provided between the third wiring layer and the fourth wiring layer,
an expression (E) is satisfied where an elastic modulus of the semiconductor chip is EM1, an elastic modulus of each of the first, second, and third resin layers is EM2, an elastic modulus of each of the first, second, third, and fourth wiring layers is EM3, and an elastic modulus of the adhesive is EM4:

$$EM1>EM3>EM2>EM4 \qquad (E),$$

the fourth wiring layer comprises a connection portion connected to the metal bump, and
a diameter of the opening of the solder resist is larger than a diameter of a connection portion of the fourth wiring layer to which the bump is connected.

14. The semiconductor device according to claim 13, wherein
the metal bump contacts a front surface and a side surface of the connection portion.

\* \* \* \* \*